United States Patent
Li et al.

(10) Patent No.: US 10,916,424 B2
(45) Date of Patent: Feb. 9, 2021

(54) METHODS FOR FORMING GRADED WURTZITE III-NITRIDE ALLOY LAYERS

(71) Applicant: KING ABDULLAH UNIVERSITY OF SCIENCE AND TECHNOLOGY, Thuwal (SA)

(72) Inventors: Xiaohang Li, Thuwal (SA); Kaikai Liu, Thuwal (SA)

(73) Assignee: KING ABDULLAH UNIVERSITY OF SCIENCE AND TECHNOLOGY, Thuwal (SA)

(*) Notice: Subject to any disclaimer, the term of this patent is extended or adjusted under 35 U.S.C. 154(b) by 0 days.

(21) Appl. No.: 16/764,192

(22) PCT Filed: Dec. 4, 2018

(86) PCT No.: PCT/IB2018/059631
§ 371 (c)(1),
(2) Date: May 14, 2020

(87) PCT Pub. No.: WO2019/111153
PCT Pub. Date: Jun. 13, 2019

(65) Prior Publication Data
US 2020/0365396 A1    Nov. 19, 2020

Related U.S. Application Data

(60) Provisional application No. 62/594,777, filed on Dec. 5, 2017.

(51) Int. Cl.
*C30B 23/00* (2006.01)
*H01L 21/02* (2006.01)
(Continued)

(52) U.S. Cl.
CPC .......... *H01L 21/0257* (2013.01); *C23C 16/34* (2013.01); *C30B 23/02* (2013.01);
(Continued)

(58) Field of Classification Search
CPC ....... C30B 23/00; C30B 23/005; C30B 25/16; C30B 29/38
See application file for complete search history.

(56) References Cited

U.S. PATENT DOCUMENTS 10,090,433 B2 * 10/2018 Dobrinsky .......... H01L 33/0025
2006/0231860 A1 * 10/2006 Mishra ................ H01L 29/7787
257/192

(Continued)

FOREIGN PATENT DOCUMENTS

| EP | 2037509 A1 | 3/2009 |
|---|---|---|
| WO | 2009148204 A1 | 12/2009 |
| WO | 2012067687 A2 | 5/2012 |

OTHER PUBLICATIONS

International Search Report in corresponding/related International Application No. PCT/IB2018/059631, dated Mar. 8, 2019.
(Continued)

*Primary Examiner* — Robert M Kunemund
(74) *Attorney, Agent, or Firm* — Patent Portfolio Builders PLLC

(57) ABSTRACT

A method for forming a semiconductor device comprising a graded wurtzite III-nitride alloy layer, including a wurtzite III-nitride alloy, on a second layer. A polarization doping concentration profile is selected for the graded wurtzite III-nitride alloy layer based on an intended function of the semiconductor device. Based on the selected polarization doping concentration profile for the graded wurtzite III-nitride alloy layer, a composition-polarization change rate of the graded wurtzite III-nitride alloy layer and a grading speed of the graded wurtzite III-nitride alloy layer are determined. The composition-polarization change rate and grading speed are based on a composition of first and second elements of the wurtzite III-nitride alloy. The graded wurtzite III-nitride alloy layer is formed on the second layer
(Continued)

having the selected polarization doping concentration profile using the determined composition-polarization change rate and grading speed to adjust the composition of the first and second III-nitride elements of the wurtzite III-nitride alloy based on a current position in the graded wurtzite III-nitride alloy layer from the second layer.

16 Claims, 4 Drawing Sheets

(51) Int. Cl.
*C23C 16/34* (2006.01)
*C30B 23/02* (2006.01)
*C30B 29/40* (2006.01)

(52) U.S. Cl.
CPC .......... *C30B 29/40* (2013.01); *H01L 21/0254* (2013.01); *H01L 21/0262* (2013.01); *H01L 21/02389* (2013.01); *H01L 21/02609* (2013.01); *H01L 21/02631* (2013.01)

(56) References Cited

U.S. PATENT DOCUMENTS

2011/0235665 A1      9/2011  Simon et al.
2014/0342512 A1*    11/2014  Mishra .................. H01L 29/205
                                                                                438/172

OTHER PUBLICATIONS

Simon, J., et al., "Polarization-Induced Hole Doping in Wide-Band-Gap Uniaxial Semiconductor Heterostructures," Science, Jan. 1, 2010, vol. 327, pp. 60-64.
Written Opinion of the International Searching Authority in corresponding/related International Application No. PCT/IB2018/059631, dated Mar. 8, 2019.

* cited by examiner

METHODS FOR FORMING GRADED WURTZITE III-NITRIDE ALLOY LAYERS

CROSS-REFERENCE TO RELATED APPLICATIONS

This application is a U.S. National Stage Application of International Application No. PCT/IB2018/059631, filed on Dec. 4, 2018, which claims priority to U.S. Provisional Patent Application No. 62/594,777, filed on Dec. 5, 2017, entitled "METHOD OF EVALUATING AND PREDICTING THE III-NITRIDE POLARIZATION DOPING EFFECT," the disclosures of which are incorporated herein by reference in their entirety.

BACKGROUND

Technical Field

Embodiments of the disclosed subject matter generally relate to methods for forming graded wurtzite III-nitride alloy layers by controlling the grading of wurtzite III-nitride elements during the formation of the graded layer so that the graded wurtzite III-nitride semiconductor layer has a particular polarization doping concentration profile.

Discussion of the Background

Wurtzite (WZ) III-nitride semiconductors and their alloys are particularly advantageous for use in optoelectronic devices, such as visible and ultraviolet light emitting diodes (LEDs), laser diodes, and high-power devices, such as high electron mobility transistors (HEMTs). Wurtzite III-nitride semiconductors typically include one or more layers of wurtzite III-nitride alloys that are n-type or p-type doped. One way of doping a wurtzite III-nitride alloy layer is to add silicon (for n-type doping) or magnesium (for p-type doping) in the wurtzite III-nitride alloy layer. This requires the introduction of a non-III-nitride element during the formation process, which complicates the formation process. In addition, it is challenging to dope larger band gap materials due to higher dopant activation energy.

Another way of forming a doped wurtzite III-nitride alloy layer is to grade the composition of the III-nitride elements, such as that disclosed in Reference [1]. Assuming a ternary wurtzite III-nitride alloy, this process involves changing the relative compositions of the two wurtzite III-nitride elements as the layer is formed so that different portions of the formed layer have different compositions of the two wurtzite III-nitride elements. However, the spontaneous and piezoelectric polarization of wurtzite III-nitride alloys are not currently well-understood, and thus the current grading techniques may not produce a graded wurtzite III-nitride alloy layer having the desired polarization doping concentration profile, and accordingly the resulting layer may not perform as intended. Specifically, conventional techniques for forming a graded wurtzite III-nitride alloy layer rely upon trial and error experiments using different compositions of the individual elements of the alloy to achieve the desired polarization doping concentration profile.

Thus, it would be desirable to provide methods for accurately adjusting the grading of a wurtzite III-nitride alloy layer to achieve a desired polarization doping concentration profile.

SUMMARY

According to an embodiment, there is a method for forming a semiconductor device comprising a graded wurtzite III-nitride alloy layer, comprising a wurtzite III-nitride alloy, on a second layer. A polarization doping concentration profile is selected for the graded wurtzite III-nitride alloy layer based on an intended function of the semiconductor device. Based on the selected polarization doping concentration profile for the graded wurtzite III-nitride alloy layer, a composition-polarization change rate of the graded wurtzite III-nitride alloy layer and a grading speed of the graded wurtzite III-nitride alloy layer are determined. The composition-polarization change rate and grading speed are based on a composition of first and second elements of the wurtzite III-nitride alloy. The graded wurtzite III-nitride alloy layer is formed on the second layer having the selected polarization doping concentration profile using the determined composition-polarization change rate and grading speed to adjust the composition of the first and second III-nitride elements of the wurtzite III-nitride alloy based on a current position in the graded wurtzite III-nitride alloy layer from the second layer.

According to another embodiment, there is a method for forming a semiconductor device comprising a graded wurtzite III-nitride alloy layer, comprising a wurtzite III-nitride alloy, on a second layer. A range of polarization doping concentration profiles is selected for the graded wurtzite III-nitride alloy layer based on an intended function of the semiconductor device. Based on the selected range of polarization doping concentration profiles for the graded wurtzite III-nitride alloy layer, a range of composition-polarization change rates of the graded wurtzite III-nitride alloy layer and a range of grading speeds of the graded wurtzite III-nitride alloy layer are determined. The range of composition-polarization change rates and the range of grading speeds are based on a composition of first and second elements of the wurtzite III-nitride alloy. The graded wurtzite III-nitride alloy layer is formed on the second layer having a polarization doping concentration profile within the selected polarization doping concentration profile range using a composition-polarization change rate within the range of determined composition-polarization change rates and a grading speed within the range of determined grading speeds to adjust the composition of the first and second III-nitride elements of the III-nitride alloy based on a current position in the graded wurtzite III-nitride alloy layer from the second layer.

According to a further embodiment, there is a method for forming semiconductor device comprising a graded wurtzite III-nitride alloy layer on a second layer. A polarization doping concentration profile for the graded wurtzite III-nitride alloy layer is determined based on a product of a composition-polarization change rate for the graded wurtzite III-nitride alloy layer and a grading speed for the graded wurtzite III-nitride alloy layer. A thickness of the graded wurtzite III-nitride alloy layer is also determined. The graded wurtzite III-nitride alloy layer comprises first and second III-nitride elements. An initial amount of the first and second III-nitride elements for forming the graded wurtzite III-nitride alloy layer then determined. Based on the polarization doping concentration profile, thickness, and the initial amount of the first and second III-nitride elements, a final amount of the first and second III-nitride elements for forming the graded wurtzite III-nitride alloy layer is determined. It is then determined, based on the final amount of the first and second III-nitride elements, to adjust the initial amount of the first and second III-nitride elements. Adjusted initial amounts of the first and second III-nitride elements are determined. Based on the polarization doping concentration profile, thickness, and the adjusted initial amount of the first and second III-nitride elements, an adjusted final amount of the first and second III-nitride elements for forming the graded wurtzite III-nitride alloy layer are determined. The graded wurtzite III-nitride alloy layer is formed so that a portion of the graded wurtzite III-nitride alloy layer adjacent to the second layer has the adjusted initial amount of the first and second III-nitride elements and a portion of the graded wurtzite III-nitride alloy layer farthest from the second layer has the adjusted final amount of the first and second III-nitride elements.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of wurtzite III-nitride ternary alloys and binary compositions.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1:
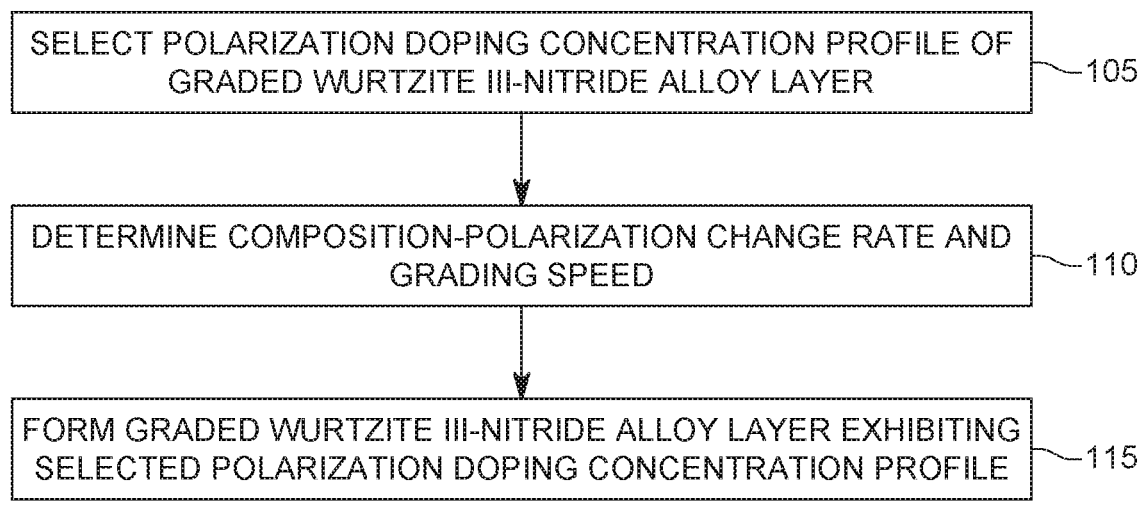
FIG. 1 is a flowchart of a method of forming a semiconductor device comprising a graded wurtzite III-nitride alloy layer on a second layer according to embodiments.

FIG. 1 illustrates a method for forming a semiconductor device comprising a graded wurtzite III-nitride alloy layer on a second layer. Initially, a polarization doping concentration profile for the graded wurtzite III-nitride alloy layer is selected based on an intended function of the semiconductor device (step 105). Those skilled in the art will recognize that different types of semiconductor devices require different amounts of doping for the III-nitride alloy layer to operate as intended. Thus, one skilled in the art will understand how to select a polarization doping concentration profile to achieve the intended function of the layer. Next, based on the selected polarization doping concentration profile for the graded wurtzite III-nitride alloy layer, a composition-polarization change rate of the graded wurtzite III-nitride alloy layer and a grading speed of the graded wurtzite III-nitride alloy layer are determined (step 110). The composition-polarization change rate and grading speed are based on a composition of first and second elements of the wurtzite III-nitride alloy. The graded wurtzite III-nitride alloy layer is formed on the second layer having the selected polarization doping concentration profile using the determined composition-polarization change rate and grading speed to adjust the composition of the first and second III-nitride elements of the wurtzite III-nitride alloy based on a current position in the graded wurtzite III-nitride alloy layer from the second layer (step 115). The graded wurtzite III-nitride alloy layer can be formed using metalorganic vapor deposition, molecular beam epitaxy, high-temperature post-deposition annealing, or any other relevant process.

Figure 2:
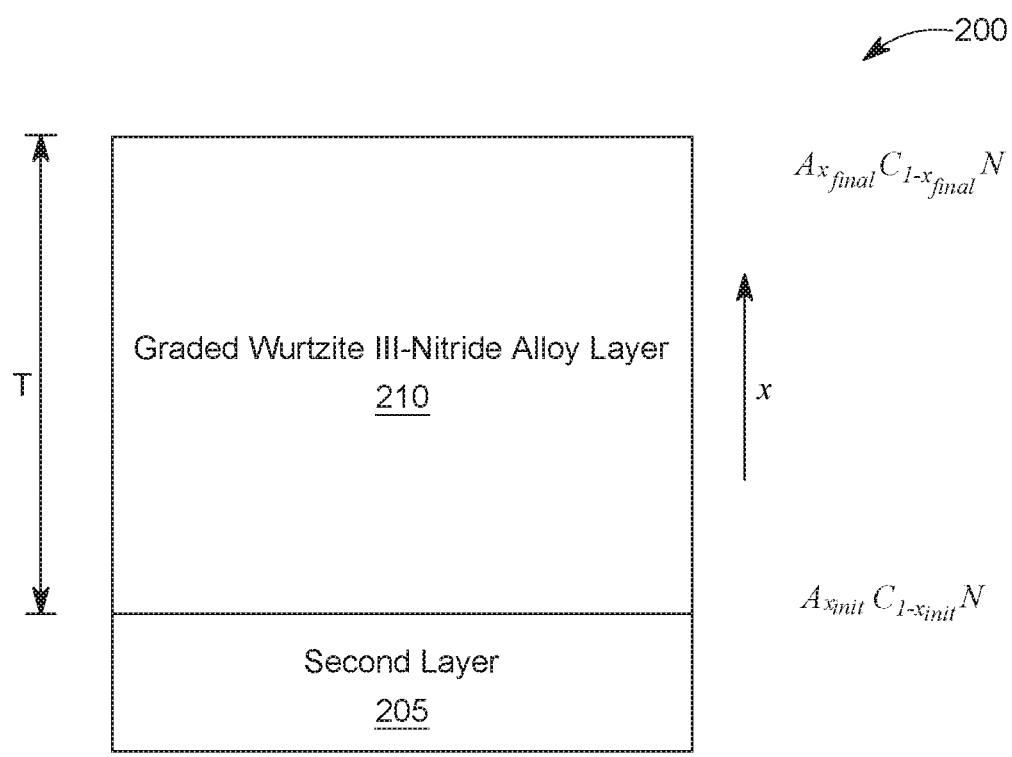
FIG. 2 is a schematic diagram of a semiconductor device comprising a graded wurtzite III-nitride alloy layer on a second layer according to embodiments.

FIG. 2 illustrates a semiconductor device formed according to the method of FIG. 1. Specifically, the semiconductor device 200 includes a graded wurtzite III-nitride alloy layer 210 formed on a second layer 205. As illustrated, the concentrations (x) of the III-nitride elements in the graded wurtzite III-nitride alloy layer 210 changes over the thickness (T) of the layer 210. Specifically, the portion of the graded wurtzite III-nitride alloy layer 210 adjacent to the second layer 205 has a composition of $A_{x_{init}}C_{1-x_{init}}N$ and the portion of the graded wurtzite III-nitride alloy layer 210 furthest from the second layer 205 has a composition of $A_{x_{final}}C_{1-x_{final}}N$, where A is the first III-nitride element of the wurtzite III-nitride alloy forming the layer 210, C is the second III-nitride element of the wurtzite III-nitride alloy forming the layer 210, and x is the amount of the corresponding III-nitride elements in the wurtzite III-nitride alloy at a particular location within the thickness of the graded wurtzite III-nitride alloy layer 210. A and C are different III-nitride elements and x is a value between 0 and 1. Accordingly, when x=0, the portion of the graded wurtzite III-nitride alloy layer 210 adjacent to the second layer will have no amount of element A and the graded layer can increase the amount of element A as the thickness (T) of the layer is formed. Of course, in other embodiments x can be a non-zero value so that the portion of the graded wurtzite III-nitride alloy layer 210 closest to the second layer includes some of the III-nitride elements A and C. The III-nitride elements A and C can be different ones of boron (B), aluminum (Al), indium (In), and gallium (Ga).

The second layer 205 can be a substrate, another graded wurtzite III-nitride alloy layer, another wurtzite III-nitride alloy layer, another semiconductor layer, an insulating layer, or a metal or conducting layer. Thus, the graded wurtzite III-nitride alloy layer 210 can be formed directly on a substrate or there can be one or more layers between the graded wurtzite III-nitride alloy layer 210 and a substrate.

The polarization doping concentration profile ($\sigma_P$) is a change in polarization (dP) relative to the change in position of the particular polarization within the layer dl, which is reflected in the following equation:

$$\sigma_P = -\frac{dP}{dl} \tag{1}$$

Because the change in polarization is based on the composition (x) of the wurtzite III-nitride alloy at a particular position within the layer, equation (1) can be rewritten as:

$$\sigma_P = -\frac{dP}{dx}\frac{dx}{dl} \quad (2)$$

The first term of equation (2) reflects the polarization change rate with respect to alloy composition, which will be referred to as the composition-polarization change rate and can be represented by the following equation:

$$k = \frac{dP}{dx} \quad (3)$$

The second term of equation (2) reflects the grading speed (i.e., the speed at which the composition of x changes over the thickness of the layer) and can be represented by the following equation:

$$v_g = \frac{dx}{dl} \quad (4)$$

The polarization doping concentration profile ($\sigma_P$) can be fixed across the thickness of the graded wurtzite III-nitride alloy layer 210 or it can be variable across the thickness of the graded wurtzite III-nitride alloy layer 210. When the polarization doping concentration profile ($\sigma_P$) is fixed, the composition-polarization change rate (k) and the grading speed ($v_g$) can both be fixed or both can be variable. Specifically, as the polarization (P) within the layer changes the composition (x) of the wurtzite III-nitride alloy changes, and because the composition-polarization change rate (k) and the grading speed ($v_g$) are based on the composition (x) and the composition change, both will either stay fixed or change. A variable polarization doping concentration profile ($\sigma_P$) would be desirable, for example, when a metal contact is formed on top of the graded wurtzite III-nitride alloy layer because in this situation it is often desirable to have the doping concentration of the top of the graded wurtzite III-nitride layer to be as high as possible to reduce the contact resistance. Thus, depending upon the composition (x) at a particular location within the thickness of the layer either or both of the composition-polarization change rate (k) and the grading speed ($v_g$) will be variable compared to other locations within the thickness of the layer. In other words, the determined grading speed will be fixed or variable across the thickness of the formed graded wurtzite III-nitride alloy layer depending on the determined variable polarization doping concentration profile and the determined variable composition-polarization change rate.

Because the composition-polarization change rate is based on the polarization for a particular composition of the wurtzite III-nitride alloy, one must determine the polarization of the wurtzite III-nitride alloy for any particular amount of x. As reflected in equation (5) below, the polarization of a particular portion of the layer $P(A_xC_{1-x}N)$ is a sum of the spontaneous polarization for a particular value of x $P_{SP}(x)$ and the piezoelectric polarization for the same value of x $P_{PZ}(x)$.

$$P(A_xC_{1-x}N) = P_{SP}(x) + P_{PZ}(x) \quad (5)$$

Substituting equation (5) into equation (3) provides that the composition-polarization change rate can be represented by the following equation:

$$\kappa(x) = \frac{dP(A_xC_{1-x}N)}{dx} = \frac{d}{dx}P_{SP}(x) + \frac{d}{dx}P_{PZ}(x) \quad (6)$$

The piezoelectric polarization $P_{PZ}(x)$ is based on the elastic and piezoelectric constants for the particular value of x, which can be represented by the following equation:

$$P_{PZ}(x) = \quad (7)$$
$$2\left[e_{31}(x) - P_{SP}(x) - \frac{c_{13}(x)}{c_{33}(x)}e_{33}(x)\right] \times \frac{\text{a\_under\_strain}(x) - a_{relax}(x)}{a_{relax}(x)}$$

where $e_{31}(x)$ and $e_{33}(x)$ are the piezoelectric constants of the particular composition of the wurtzite III-nitride alloy in the layer in units of C/m$^2$, C13(x) and $C_{33}(x)$ are the elastic constants of the particular composition of the wurtzite III-nitride alloy in the layer in units of GPa, a_under_strain (x) is the lattice constant, in units of Å, of the particular composition of the wurtzite III-nitride alloy in the layer when that composition is strained, and $a_{relax}(x)$ is the lattice constant, in units of Å, of the particular composition of the wurtzite III-nitride alloy in the layer when that composition is fully relaxed. Substituting equation (7) into equation (6) provides the following equation:

$$\kappa(x) = \frac{d}{dx}P_{SP}(x) + \frac{d}{dx}\left\{2\left[e_{31}(x) - P_{SP}(x) - \frac{C_{13}(x)}{C_{33}(x)}e_{33}(x)\right] \times \frac{a(x)\_\text{under strain} - a(x)\_\text{relaxed}}{a(x)\_\text{relaxed}}\right\} \quad (8)$$

Thus, for a particular composition xo, the composition-polarization change rate can be represented by the following equation:

$$\kappa(xo) = \frac{d}{dx}P_{SP}(x)\bigg|_{x=xo} + \frac{d}{dx}\left\{2\left[e_{31}(x) - P_{SP}(x) - \frac{C_{13}(x)}{C_{33}(x)}e_{33}(x)\right] \times \frac{a(x)\_\text{under strain} - a(x)\_\text{relaxed}}{a(x)\_\text{relaxed}}\right\}\bigg|_{x=xo} \quad (9)$$

As will be appreciated from equation (9), a particular wurtzite III-nitride alloy at different compositions can have different polarization change rates. Further, a particular wurtzite III-nitride alloy under different strain conditions can have different polarization change rate. Moreover, wurtzite III-nitride alloys at the same or different compositions can have different polarization change rates.

Referring again to FIG. 2, depending upon device application, one can choose to grade the material composition x from the initial composition $x_{init}$ to the final composition $x_{init}$ linearly or non-linearly depending on the value of k(x) in the range represented by equation (9).

The determination of the spontaneous polarization $P_{SP}(x)$, piezoelectric constants $e_{31}(x)$ and $e_{33}(x)$, and the elastic constants $C_{13}(x)$ and $C_{33}(x)$ for a number of wurtzite III-nitride alloys will now be described in more detail.

The spontaneous polarization of a wurtzite aluminum gallium nitride (AlGaN) layer, a wurtzite indium gallium nitride (InGaN) layer, a wurtzite indium aluminum nitride (InAlN) layer, and a wurtzite boron aluminum nitride (BAlN) layer can be determined using the following equations:

$$P_{sp}^{(H\ Ref)}(Al_xGa_{1-x}N) = 0.0072x^2 - 0.0127x + 1.3389 \quad (10)$$

$$P_{sp}^{(H\ Ref)}(In_xGa_{1-x}N) = 0.1142x^2 - 0.2892x + 1.3424 \quad (11)$$

$$P_{sp}^{(H\ Ref)}(In_xAl_{1-x}N) = 0.1563x^2 - 0.3323x + 1.3402 \quad (12)$$

$$P_{sp}^{(H\ Ref)}(B_xAl_{1-x}N) = 0.6287x^2 + 0.1217x + 1.3542 \quad (13)$$

$$P_{sp}^{(H\ Ref)}(B_xGa_{1-x}N) = 0.4383x^2 + 0.3135x + 1.3544 \quad (14)$$

The piezoelectric constants e31 and e33 of a wurtzite AlGaN layer, a wurtzite InGaN layer, wurtzite InAlN layer, wurtzite BAlN layer, and wurtzite BGaN layer can be determined using the following equations:

$$e_{31}(Al_xGa_{1-x}N) = -0.0573x^2 - 0.2536x - 0.3582 \quad (15)$$

$$e_{33}(Al_xGa_{1-x}N) = 0.3949x^2 + 0.6324x + 0.6149 \quad (16)$$

$$e_{31}(In_xGa_{1-x}N) = 0.2396x^2 - 0.4483x - 0.3399 \quad (17)$$

$$e_{33}(In_xGa_{1-x}N) = -0.1402x^2 + 0.5902x + 0.6080 \quad (18)$$

$$e_{31}(In_xAl_{1-x}N) = -0.0959x^2 + 0.239x - 0.6699 \quad (19)$$

$$e_{33}(In_xAl_{1-x}N) = 0.9329x^2 - 1.5036x + 1.6443 \quad (20)$$

$$e_{31}(B_xAl_{1-x}N) = 1.7616x^2 - 0.9003x - 0.6016 \quad (21)$$

$$e_{33}(B_xAl_{1-x}N) = -4.0355x^2 + 1.6836x + 1.5471 \quad (22)$$

$$e_{31}(B_xGa_{1-x}N) = 0.9809x^2 - 0.4007x - 0.3104 \quad (23)$$

$$e_{33}(B_xGa_{1-x}N) = -2.1887x^2 + 0.8174x + 0.5393 \quad (24)$$

The elastic constants $C_{13}$ and $C_{33}$ can be determined using the Vegard's law and the binary constants using the equations below or they can be obtained by direct calculation of the ternary constants.

$$C_{13}(B_xAl_{1-x}N) = xC_{13}(BN) + (1-x)C_{13}(AlN) \quad (25)$$

$$C_{13}(B_xGa_{1-x}N) = xC_{13}(BN) + (1-x)C_{13}(GaN) \quad (26)$$

$$C_{13}(Al_xGa_{1-x}N) = xC_{13}(AlN) + (1-x)C_{13}(GaN) \quad (27)$$

$$C_{13}(In_xGa_{1-x}N) = xC_{13}(InN) + (1-x)C_{13}(GaN) \quad (28)$$

$$C_{13}(In_xAl_{1-x}N) = xC_{13}(InN) + (1-x)C_{13}(AlN) \quad (29)$$

$$C_{33}(B_xAl_{1-x}N) = xC_{33}(BN) + (1-x)C_{33}(AlN) \quad (30)$$

$$C_{33}(B_xGa_{1-x}N) = xC_{33}(BN) + (1-x)C_{33}(GaN) \quad (31)$$

$$C_{33}(Al_xGa_{1-x}N) = xC_{33}(AlN) + (1-x)C_{33}(GaN) \quad (32)$$

$$C_{33}(In_xGa_{1-x}N) = xC_{33}(InN) + (1-x)C_{33}(GaN) \quad (33)$$

$$C_{33}(In_xAl_{1-x}N) = xC_{33}(InN) + (1-x)C_{33}(AlN) \quad (34)$$

The lattice constants of the wurtzite BAlN, wurtzite BGaN, wurtzite InAlN, wurtzite AlGaN, and wurtzite InGaN can be calculated as follows:

$$a(B_xAl_{1-x}N) = -0.157x^2 - 0.408x + 3.109 (\text{Å}) \quad (35)$$

$$a(B_xGa_{1-x}N) = -0.101x^2 - 0.529x + 3.176 (\text{Å}) \quad (36)$$

$$a(In_xAl_{1-x}N) = 0.05298x^2 + 0.37398x + 3.109 (\text{Å}) \quad (37)$$

$$a(Al_xGa_{1-x}N) = 0.01589x^2 - 0.08416x + 3.182 (\text{Å}) \quad (38)$$

$$a(In_xGa_{1-x}N) = 0.012x^2 + 0.34694x + 3.182 (\text{Å}) \quad (39)$$

Figure 3:
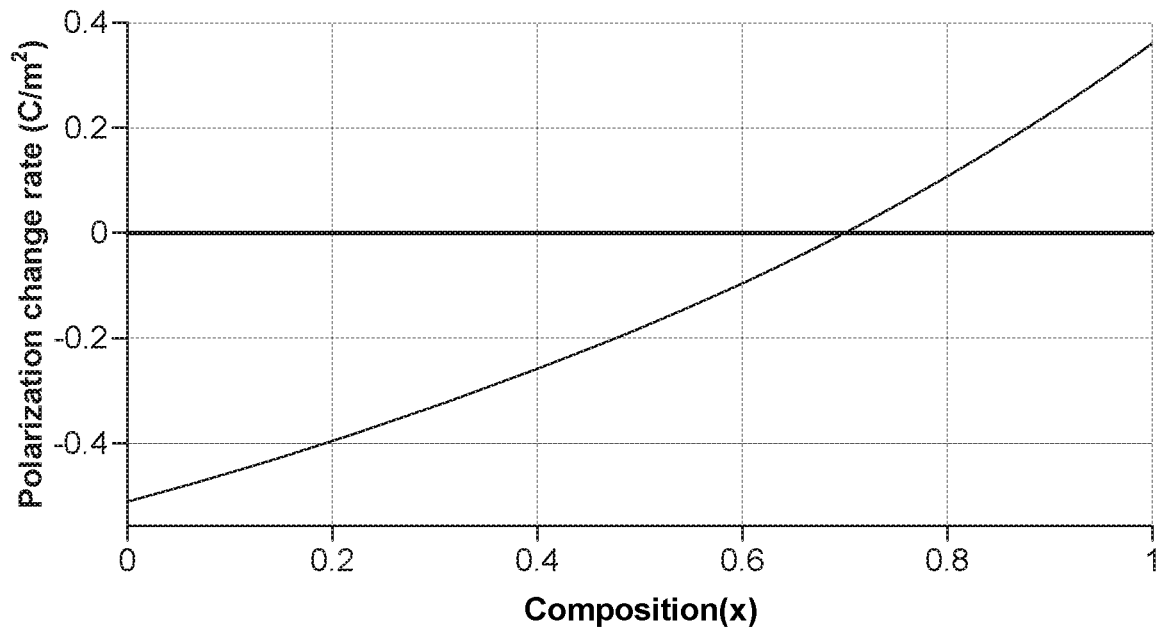
FIG. 3 is a graph of the composition-polarization change rate k(x) as a function of composition x of a wurtzite III-nitride ternary alloy $A_xC_{1-x}N$ according to embodiments.

FIG. 3 is a graph of the composition-polarization change rate k(x) as a function of composition x of a wurtzite III-nitride ternary alloy $A_xC_{1-x}N$. As will be appreciated from the graph, the composition-polarization change rate k(x) varies at different composition x. It can be negative or positive for inducing free electrons or holes, respectively. Therefore, choosing the right grading composition ranges is very important for effective polarization doping. This graph can be used in connection with the equations above or in place of the equations above to select different compositions of x for wurtzite III-nitride ternary alloy $A_xC_{1-x}N$ to achieve a particular composition-polarization change rate k(x). Similarly, this graph can be used in connection with the equations above or in place of the equations above to select a particular composition-polarization change rate k(x) to achieve a particular composition of x for wurtzite III-nitride ternary alloy $A_xC_{1-x}N$.

The method of FIG. 1 provides specific composition-polarization change rates and grading speeds to achieve a selected polarization doping concentration profile. However, due to limits on the technology for forming the graded wurtzite III-nitride alloy layer, the particular composition-polarization change rates and grading speeds may not be achievable. A specific value for the polarization doping concentration profile is sometimes not required in practice. Instead a range of values can also be used in certain circumstances while still achieving the desired effect. A method that employs a range of polarization doping concentration profiles according to embodiments will now be described in connection with FIG. 4, which is a flowchart of a method for forming a semiconductor device comprising a graded wurtzite III-nitride alloy layer on a second layer according to embodiments.

Initially, a polarization doping concentration profile range is selected for the graded wurtzite III-nitride alloy layer based on an intended function of the semiconductor device (step 405). Next, based on the selected polarization doping concentration profile range, a range of composition-polarization change rates for the graded wurtzite III-nitride alloy layer and a range of grading speeds for the graded wurtzite III-nitride alloy layer are determined (step 410). The range of composition-polarization change rates and the range of grading speeds are based on a composition of first and second elements of the wurtzite III-nitride alloy. Next, the graded wurtzite III-nitride alloy layer is formed on the second layer having a polarization doping concentration profile within the selected polarization doping concentration profile range using a composition-polarization change rate within the range of determined composition-polarization change rates and a grading speed within the range of determined the grading speeds to adjust the composition of the first and second III-nitride elements of the wurtzite III-nitride alloy based on a current position in the graded wurtzite III-nitride alloy layer from the second layer (step 415).

Due to the relationship between the composition-polarization change rate and the grading speed, as reflected in equation (2), one cannot arbitrarily select any composition-polarization change rate and the grading speed from the ranges. Instead, each composition-polarization change rate within the range is associated with a grading speed within its own range.

Figure 4:
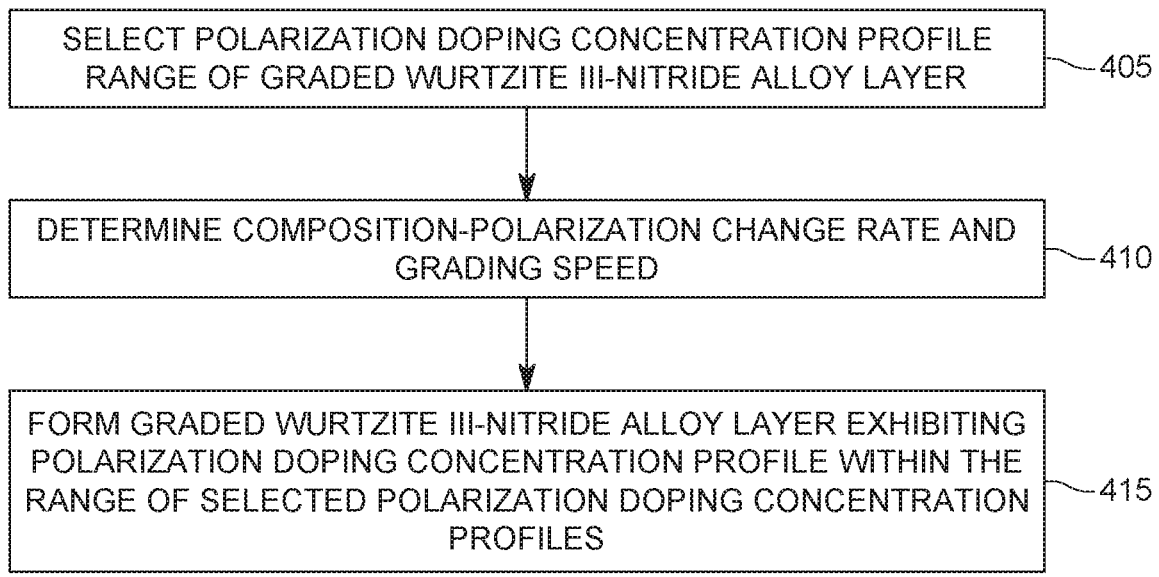
FIG. 4 is a flowchart of a method of forming a semiconductor device comprising a graded wurtzite III-nitride alloy layer on a second layer according to embodiments.

The method of FIG. 4 provides additional flexibility compared to the method of FIG. 1 because a range of polarization doping concentration profiles provides ranges of composition-polarization change rates and grading speeds from which one can select based on the particular technology used to form the graded wurtzite III-nitride alloy layer.

Figure 5A:
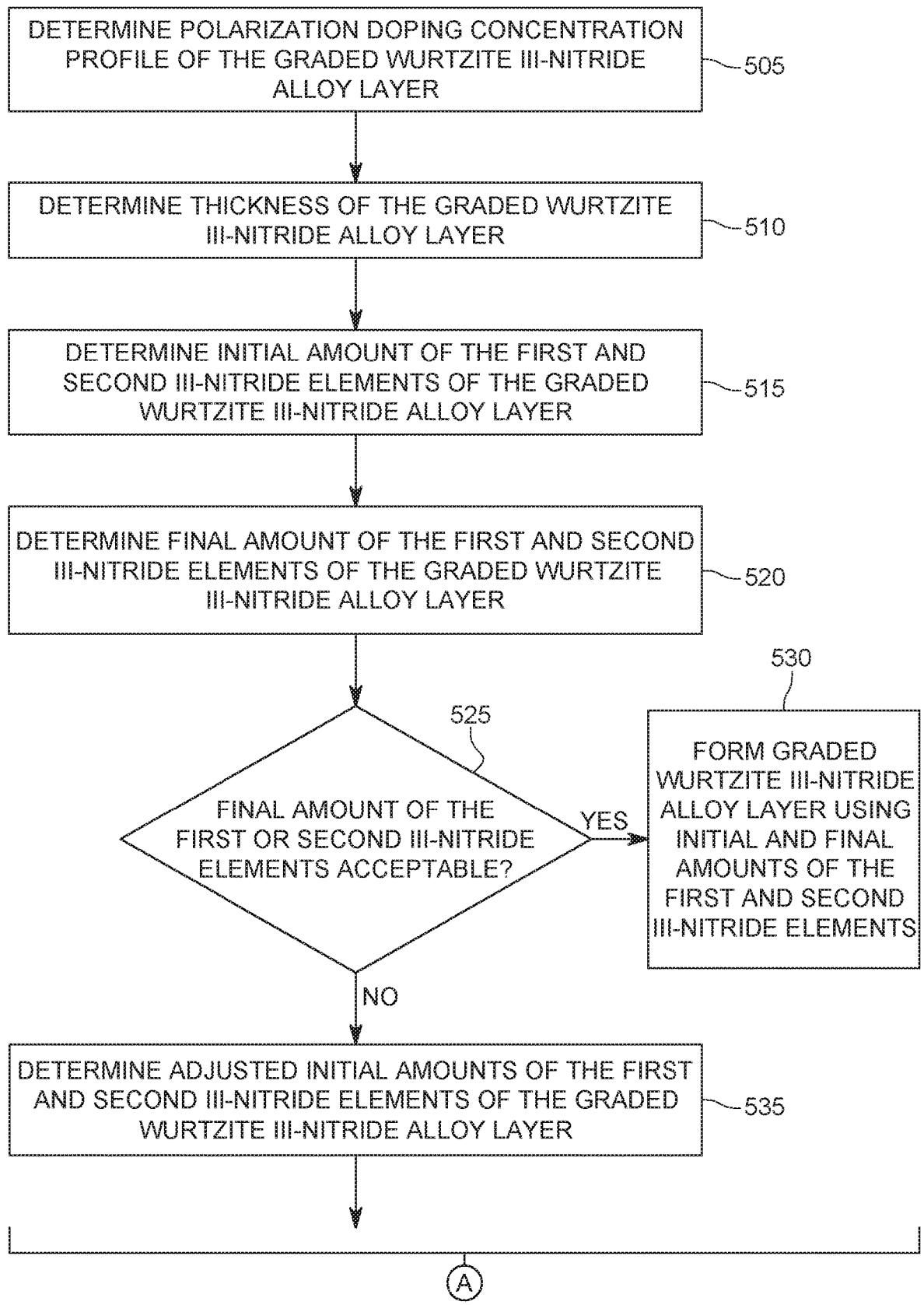
FIGS. 5A and 5B are flowcharts of a method of forming a semiconductor device comprising a graded wurtzite III-nitride alloy layer on a second layer according to embodiments.
Figure 5B:
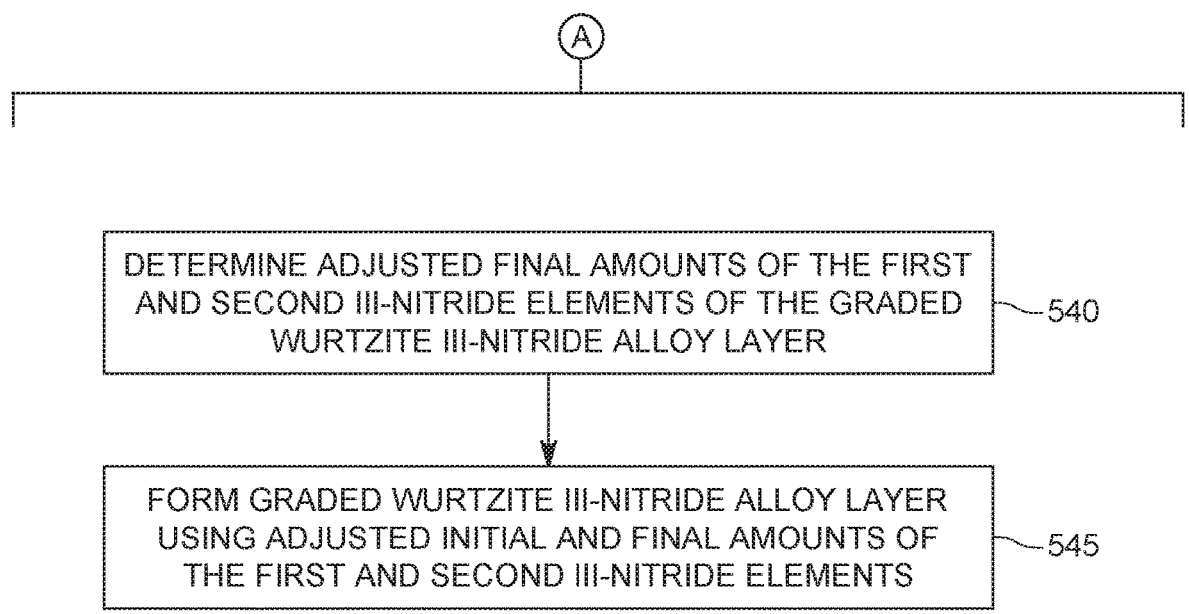

A large grading composition range can result in a graded wurtzite III-nitride alloy layer having a large lattice mismatch with the second layer, which can result in reduced performance of a semiconductor device having graded wurtzite III-nitride alloy layer. This can be caused by selecting an initial value for x that is so large to result in the large grading composition. FIGS. 5A and 5B illustrates a method for addressing this problem by adjusting the initial value for x.

Initially, a polarization doping concentration profile for the graded wurtzite III-nitride alloy layer is determined based on a product of a composition-polarization change rate for the graded wurtzite III-nitride alloy layer and a grading speed for the graded wurtzite III-nitride alloy layer (step 505). Next, a thickness of the graded wurtzite III-nitride alloy layer is determined (step 510). The graded wurtzite III-nitride alloy layer comprises first and second III-nitride elements.

An initial amount of the first and second III-nitride elements for forming the graded wurtzite III-nitride alloy layer is then determined (step 515). Based on the polarization doping concentration profile, thickness, and the initial amount of the first and second III-nitride elements, a final amount of the first and second III-nitride elements for forming the graded wurtzite III-nitride alloy layer is determined (step 520). If the final amounts of the first and second III-nitride elements are acceptable ("Yes" path out of decision step 525), then the graded wurtzite III-nitride alloy layer is formed using the initial and final amounts of the first and second III-nitride elements (step 530).

If the final amounts of the first and second III-nitride elements are not acceptable ("No" path out of decision step 525), then the initial amount of the first and second III-nitride elements is adjusted (step 535). Based on the polarization doping concentration profile, thickness, and the adjusted initial amount of the first and second III-nitride elements, an adjusted final amount of the first and second III-nitride elements for forming the graded wurtzite III-nitride alloy layer is determined (step 540). The graded wurtzite III-nitride alloy layer is formed so that a portion of the graded wurtzite III-nitride alloy layer adjacent to the second layer has the adjusted initial amount of the first and second III-nitride elements and a portion of the graded wurtzite III-nitride alloy layer farthest from the second layer has the adjusted final amount of the first and second III-nitride elements (step 545).

Although the discussion above relates to wurtzite III-nitride alloys, the discussion equally applies to wurtzite III-nitride binary compositions (e.g., AlN, GaN, etc.). Thus, any of the methods discussed above can be employed using wurtzite III-nitride binary compositions. Thus, reference to a wurtzite III-nitride composition or wurtzite III-nitride layer includes such compositions or layers that are alloys or that are binary compositions.

The discussion above relates to wurtzite ternary III-nitride alloys. It will be recognized by those skilled in the art that a wurtzite ternary III-nitride alloy may include insignificant concentrations of additional elements. These insignificant concentrations of additional elements can arise due to contaminants or impurities becoming part of the graded wurtzite III-nitride alloy layer during the process of forming the layer. These contaminants or impurities typically comprise less than 0.1% of the overall composition of the graded wurtzite III-nitride ternary alloy layer. Further, those skilled in the art would also consider a graded wurtzite III-nitride alloy as a ternary alloy when, in addition to two group III elements, there is an insubstantial amount of other elements, including other group III elements. Those skilled in the art would consider a concentration of 0.1% or less of an element being an insubstantial amount. Thus, for example, one skilled in the art would consider a layer comprising $Al_xGa_{1-x-y}In_yN$, where $y \leq 0.1\%$, as a ternary alloy because it includes an insubstantial amount of indium. Similarly, a wurtzite III-nitride binary composition can include insignificant concentrations of additional elements while still being considered a binary composition.

The disclosed embodiments provide methods for forming graded wurtzite III-nitride alloy layers in semiconductor devices. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

[1] "Polarization-Induced Hole Doping in WideBand-Gap Uniaxial Semiconductor Heterostructures", Simon et al., SCIENCE, 01 JAN 2010 : 60-64.

What is claimed is:
1. A method for forming a semiconductor device comprising a graded wurtzite III-nitride alloy layer, comprising a wurtzite III-nitride alloy, on a second layer, the method comprising:
selecting a polarization doping concentration profile for the graded wurtzite III-nitride alloy layer based on an intended function of the semiconductor device;
determining, based on the selected polarization doping concentration profile for the graded wurtzite III-nitride alloy layer, a composition-polarization change rate of the graded wurtzite III-nitride alloy layer and a grading speed of the graded wurtzite III-nitride alloy layer, wherein the composition-polarization change rate and grading speed are based on a composition of first and second elements of the wurtzite III-nitride alloy; and
forming the graded wurtzite III-nitride alloy layer on the second layer having the selected polarization doping concentration profile using the determined composition-polarization change rate and grading speed to adjust the composition of the first and second III-nitride elements of the wurtzite III-nitride alloy based on a current position in the graded wurtzite III-nitride alloy layer from the second layer, wherein the polarization doping concentration profile is determined using a product of the composition-polarization change rate for the graded wurtzite III-nitride alloy layer and the grading speed for the graded wurtzite III-nitride alloy layer.

2. The method of claim 1, wherein the composition-polarization change rate for the graded wurtzite III-nitride alloy layer is determined based on $$K = \frac{dP}{dx},$$

where dP is a change in polarization and dx is a change in composition of the graded wurtzite III-nitride alloy layer.

3. The method of claim 2, wherein the grading speed is determined based on $$v_g = \frac{dx}{dl},$$

where dx is a change in composition of the graded wurtzite III-nitride alloy layer and dl is a change in distance in a thickness direction of the graded wurtzite III-nitride alloy layer.

4. The method of claim 3, wherein the graded wurtzite III-nitride alloy layer comprises a first III-nitride having a first concentration and a second III-nitride having a second concentration, wherein the formation of the graded wurtzite III-nitride alloy layer comprises:
changing a relative amount of the first concentration of the first III-nitride to the second concentration of the second III-nitride based on a change in distance from the second layer.

5. The method of claim 1, wherein the formed graded wurtzite III-nitride alloy layer is a doped layer without intentionally adding other elements to the graded wurtzite III-nitride alloy layer.

6. The method of claim 1, wherein
a polarization doping concentration of the determined polarization doping concentration profile is fixed across a thickness of the formed graded wurtzite III-nitride alloy layer,
the determined composition-polarization change rate is variable across the thickness of the formed graded wurtzite III-nitride alloy layer, and
the determined grading speed is variable across the thickness of the formed graded wurtzite III-nitride alloy layer.

7. The method of claim 1, wherein
a polarization doping concentration of the determined polarization doping concentration profile is fixed across a thickness of the formed graded wurtzite III-nitride alloy layer,
the determined composition-polarization change rate is variable across the thickness of the formed graded wurtzite III-nitride alloy layer, and
the determined grading speed is fixed across the thickness of the formed graded wurtzite III-nitride alloy layer.

8. The method of claim 1, wherein
a polarization doping concentration of the determined polarization doping concentration profile is variable across a thickness of the formed graded wurtzite III-nitride alloy layer,
the determined composition-polarization change rate is variable across the thickness of the formed graded wurtzite III-nitride alloy layer, and
the determined grading speed is fixed or variable across the thickness of the formed graded wurtzite III-nitride alloy layer depending on the determined variable polarization doping concentration and the determined variable composition-polarization change rate.

9. The method of claim 1, wherein the second layer is a gallium nitride substrate or an aluminum nitride substrate.

10. A method for forming a semiconductor device comprising a graded wurtzite III-nitride alloy layer, comprising a wurtzite III-nitride alloy, on a second layer, the method comprising:
selecting a range of polarization doping concentration profiles for the graded wurtzite III-nitride alloy layer based on an intended function of the semiconductor device;
determining, based on the selected range polarization doping concentration profiles for the graded wurtzite III-nitride alloy layer, a range of composition-polarization change rates of the graded wurtzite III-nitride alloy layer and a range of grading speeds of the graded wurtzite III-nitride alloy layer, wherein the range of composition-polarization change rates and the range of grading speeds are based on a composition of first and second elements of the wurtzite III-nitride alloy; and
forming the graded wurtzite III-nitride alloy layer on the second layer having a polarization doping concentration profile within the selected range of polarization doping concentration profiles using a composition-polarization change rate within the range of determined composition-polarization change rates and a grading speed within the range of determined grading speeds to adjust the composition of the first and second III-nitride elements of the III-nitride alloy based on a current position in the graded wurtzite III-nitride alloy layer from the second layer,
wherein the range of polarization doping concentration profiles is determined using a product of the composition-polarization change rate for the graded wurtzite III-nitride alloy layer and the grading speed for the graded wurtzite III-nitride alloy layer, and
wherein the range of composition-polarization change rates for the graded wurtzite III-nitride alloy layer is determined based on $$K = \frac{dP}{dx},$$

where dP is a change in polarization and dx is a change in composition for the graded wurtzite III-nitride alloy layer.

11. The method of claim 10, wherein the range of grading speeds are determined based on $$v_g = \frac{dx}{dl},$$

where dx is a change in composition of the graded wurtzite III-nitride alloy layer and dl is a change in distance in a thickness direction of the graded wurtzite III-nitride alloy layer.

12. The method of claim 11, wherein the graded wurtzite III-nitride alloy layer comprises a first III-nitride having a first concentration and a second III-nitride having a second concentration, wherein the formation of the graded wurtzite III-nitride alloy layer comprises:
  changing a relative amount of the first concentration of the first III-nitride to the second concentration of the second III-nitride based on a change in distance in the thickness direction of the graded wurtzite III-nitride alloy layer.

13. A method for forming semiconductor device comprising a graded wurtzite III-nitride alloy layer on a second layer, the method comprising:
  determining a polarization doping concentration profile for the graded wurtzite III-nitride alloy layer based on a product of a composition-polarization change rate for the graded wurtzite III-nitride alloy layer and a grading speed for the graded wurtzite III-nitride alloy layer;
  determining a thickness (T) of the graded wurtzite III-nitride alloy layer, wherein the graded wurtzite III-nitride alloy layer comprises first and second III-nitride elements;
  determining an initial amount of the first and second III-nitride elements for forming the graded wurtzite III-nitride alloy layer;
  determining, based on the polarization doping concentration profile, thickness (T), and the initial amount of the first and second III-nitride elements, a final amount of the first and second III-nitride elements for forming the graded wurtzite III-nitride alloy layer;
  determining, based on the final amount of the first and second III-nitride elements, to adjust the initial amount of the first and second III-nitride elements;
  determining adjusted initial amounts of the first and second III-nitride elements;
  determining, based on the polarization doping concentration profile, thickness (T), and the adjusted initial amount of the first and second III-nitride elements, an adjusted final amount of the first and second III-nitride elements for forming the graded wurtzite III-nitride alloy layer; and
  forming the graded wurtzite III-nitride alloy layer so that a portion of the graded wurtzite III-nitride alloy layer adjacent to the second layer has the adjusted initial amount of the first and second III-nitride elements and a portion of the graded wurtzite III-nitride alloy layer farthest from the second layer has the adjusted final amount of the first and second III-nitride elements,
  wherein the composition-polarization change rate for the graded wurtzite III-nitride alloy layer is determined based on $$K = \frac{dP}{dx},$$

where dP is a change in polarization and dx is a change in composition for the graded wurtzite III-nitride alloy layer.

14. The method of claim 13, wherein the grading speed is determined based on $$v_g = \frac{dx}{dl},$$

where dx is a change in composition of the graded wurtzite III-nitride alloy layer and dl is a change in distance in a thickness direction of the graded wurtzite III-nitride alloy layer.

15. The method of claim 14, wherein the graded wurtzite III-nitride alloy layer comprises a first III-nitride having a first concentration and a second III-nitride having a second concentration, wherein the formation of the graded wurtzite III-nitride alloy layer comprises:
  changing a relative amount of the first concentration of the first III-nitride to the second concentration of the second III-nitride based on a change in distance from the second layer.

16. The method of claim 13, wherein the graded wurtzite III-nitride alloy layer is formed using metalorganic vapor deposition, molecular beam epitaxy or high-temperature post-deposition annealing.

* * * * *